United States Patent
Axelowitz et al.

(10) Patent No.: US 9,443,830 B1
(45) Date of Patent: Sep. 13, 2016

(54) PRINTED CIRCUITS WITH EMBEDDED SEMICONDUCTOR DIES

(71) Applicant: Apple Inc., Cupertino, CA (US)

(72) Inventors: Corey N. Axelowitz, San Francisco, CA (US); Eric C. Lee, Mountain View, CA (US); Shawn Xavier Arnold, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/734,951

(22) Filed: Jun. 9, 2015

(51) Int. Cl.
*H01L 25/065* (2006.01)
*H01L 23/498* (2006.01)

(52) U.S. Cl.
CPC ......... *H01L 25/0657* (2013.01); *H01L 23/498* (2013.01); *H01L 23/49811* (2013.01); *H01L 23/49827* (2013.01); *H01L 2225/0651* (2013.01); *H01L 2225/06541* (2013.01); *H01L 2225/06555* (2013.01)

(58) Field of Classification Search
CPC ............ H01R 13/665; H01R 13/6581; H01L 23/49811; H01L 23/49822; H01L 23/49827; H01L 23/49833; H01L 23/49844; H01L 25/0657; H01L 2225/06558
USPC ....................................................... 257/772
See application file for complete search history.

(56) References Cited

U.S. PATENT DOCUMENTS

| | | | |
|---|---|---|---|
| 7,554,185 B2 | 6/2009 | Foong et al. | |
| 7,666,035 B2 | 2/2010 | Salomon et al. | |
| 7,944,035 B2 | 5/2011 | Bol | |
| 8,101,458 B2 | 1/2012 | Kumar et al. | |
| 8,685,798 B2 | 4/2014 | Shao et al. | |
| 8,913,402 B1 | 12/2014 | Berg et al. | |
| 2008/0315372 A1 | 12/2008 | Kuan et al. | |
| 2009/0294911 A1* | 12/2009 | Pagaila | H01L 21/561 257/620 |
| 2009/0308652 A1 | 12/2009 | Shih | |
| 2010/0006994 A1* | 1/2010 | Shim | H01L 21/561 257/676 |
| 2011/0045634 A1 | 2/2011 | Pagaila | |
| 2014/0068933 A1 | 3/2014 | Brickner et al. | |
| 2014/0134760 A1 | 5/2014 | Arnold et al. | |
| 2014/0162470 A1 | 6/2014 | Frickner | |

OTHER PUBLICATIONS

Axelowitz et al., U.S. Appl. No. 14/752,667, filed Jun. 26, 2015.

* cited by examiner

*Primary Examiner* — Yasser A Abdelaziez
(74) *Attorney, Agent, or Firm* — Treyz Law Group, P.C.; G. Victor Treyz; Joseph F. Guihan

(57) ABSTRACT

Electrical components such as semiconductor die may be mounted in semiconductor packages and embedded within printed circuits. A printed circuit may have a substrate with an opening and may have metal layers. During lamination operations, substrate material such as prepreg may flow and form embedding dielectric material that embeds the semiconductor die within the opening. Double-sided semiconductor dies may be formed by attaching multiple semiconductor dies together using a layer of material such as die attach film. The double-sided semiconductor dies may be embedded within a printed circuit and mounted in semiconductor packages. Wire bond wires may be used to couple one of the semiconductor dies in a double-sided semiconductor die to contacts on a substrate. Wire bond wires may also be used to couple a shield layer to the substrate.

16 Claims, 9 Drawing Sheets

PRINTED CIRCUITS WITH EMBEDDED SEMICONDUCTOR DIES

BACKGROUND

This relates generally to electronic devices, and, more particularly, to electronic devices with semiconductor devices and printed circuit boards.

Electronic devices such as computers, cellular telephones, and other devices include semiconductor components. Semiconductor dies can be encased in semiconductor packages and mounted to printed circuit boards. In some applications, conventional semiconductor packages are too bulky, so semiconductor dies are embedded within printed circuit board structures.

Although the use of conventional printed circuit board and semiconductor die structures may be satisfactory in some circumstances, challenges can arise when attempting to construct robust devices with compact circuitry. If care is not taken, printed circuit board and semiconductor die structures may be overly bulky and may not fit appropriately within an electronic device.

SUMMARY

Circuitry such as semiconductor dies may be mounted in semiconductor packages and embedded within printed circuits. A printed circuit may have a substrate with an opening and may have patterned metal layers for conveying signals. During lamination operations, substrate material such as prepreg in the printed circuit may flow and thereby form embedding dielectric material that secures a semiconductor die within the opening.

Double-sided semiconductor die may be embedded within printed circuits and mounted in packages. A double-sided semiconductor die may be formed by attaching multiple semiconductor dies together in a back-to-back configuration using a layer of material such as die attach film.

Double-sided semiconductor dies may be coupled to contacts on a substrate using wire bond wires. The wire bond wires may be used to couple a first semiconductor die in a double-sided die to contacts on the substrate while solder is used to couple a second semiconductor die in the double-sided die to contacts on the substrate.

To reduce interference, a shield layer may be interposed between first and second semiconductor dies in a double-sided die configuration. A first set of wire bond wires may be coupled between the shield and a first set of substrate contacts and a second set of wire bond wires may be coupled between the first semiconductor die and a second set of substrate contacts. The second semiconductor die may be coupled to a third set of substrate contacts using solder.

DETAILED DESCRIPTION

An electronic device may have electrical components. The electrical components can be mounted in packages, may be mounted to the surfaces of printed circuits, and may be embedded within printed circuits. Examples of electrical components that may be incorporated into the electronic device include discrete components such as resistors, inductors, and capacitors, semiconductor dies (e.g., silicon integrated circuit dies or circuitry formed from other semiconductors), connectors, sensors, input-output devices such as buttons, and other devices. In scenarios in which components such as semiconductor dies and other circuitry can be embedded within printed circuits, space may be conserved and device size can be minimized. Illustrative embedded component scenarios in which the embedded component includes at least one semiconductor die are sometimes described herein as an example. In general, any suitable electrical component may be embedded within a printed circuit, packaged in a semiconductor package, and/or mounted on the surface of printed circuit. The use of printed circuits with embedded semiconductor dies to form an electronic device is merely illustrative.

Figure 1:
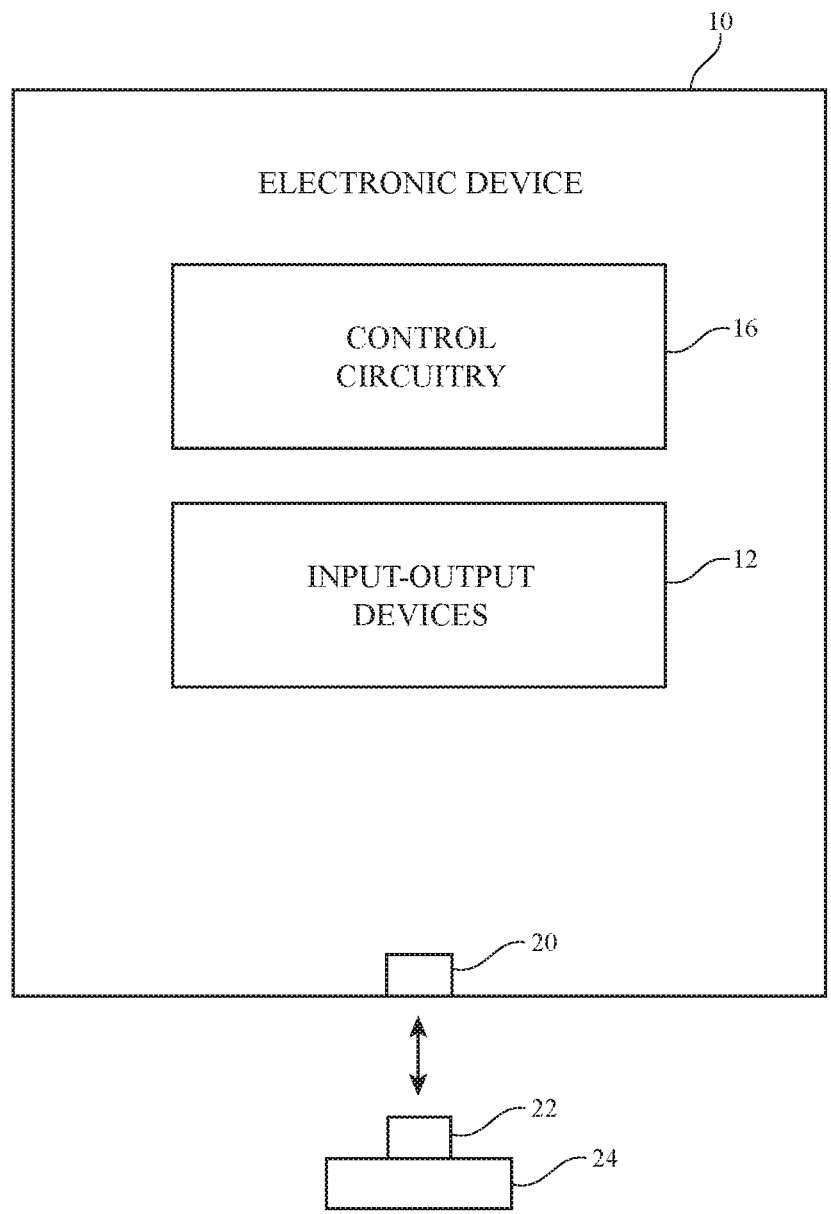
FIG. 1 is a schematic diagram of an illustrative electronic device in accordance with an embodiment.

An illustrative electronic device of the type that may include printed circuits with embedded semiconductor dies is shown in FIG. 1. Device 10 may be a tablet computer, laptop computer, a desktop computer, a display, a cellular telephone, a media player, a wristwatch device or other wearable electronic equipment, equipment embedded in a larger system, or other suitable electronic device.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, displays, etc. A user can control the operation of device 10 by supplying commands through input-output devices 12 and may receive status information and other output from device 10 using the output resources of input-output devices 12.

Device 10 (e.g., input-output devices 12) may include one or more connectors (e.g., Universal Serial Bus connectors (A type, B type, A, C-type, Mini), DisplayPort™ connectors, Apple Lightning® connectors, HDMI® connectors, or any other suitable connectors). A connector in device 10 such as connector 20 may be configured to mate with a connector such as connector 22 (e.g., Universal Serial Bus connectors (A type, B type, A, C-type, Mini), DisplayPort™ connectors, Apple Lightning® connectors, HDMI® connectors, or any other suitable connectors). Connector 22 may be associated with external equipment 24. Equipment 24 may be an accessory, a cable that is terminated with connector 22, another device such as device 10, or any other suitable circuitry or device. Connectors such as connectors 20 and 22 may incorporate printed circuits (e.g., for forming contact pads and associated connector circuitry).

Figure 2:
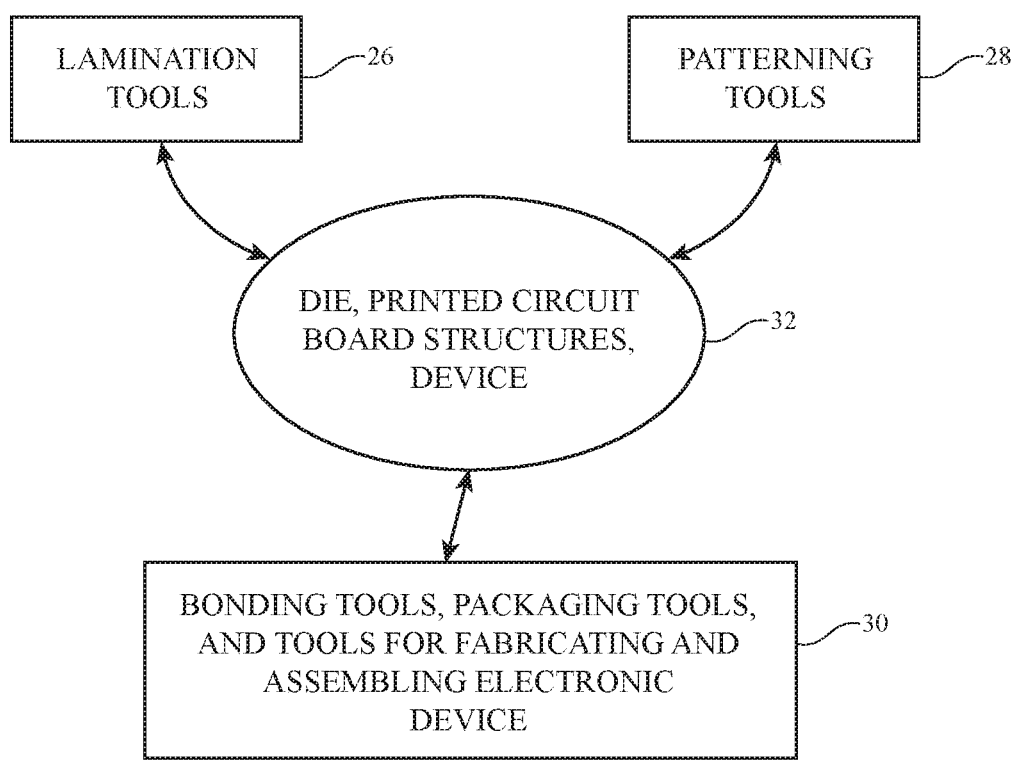
FIG. 2 is a diagram of illustrative equipment of the type that may be used in processing printed circuit and semiconductor die structures for an electronic device in accordance with an embodiment.

Illustrative equipment of the type that may be used in forming printed circuit structures for use in connectors 20, 22, and/or in devices such as device 10 and external equipment 24 is shown in FIG. 2. As shown in FIG. 2, one or more semiconductor dies, printed circuit board structures, and other electronic device components (shown collectively as structures 32) may be processed using equipment such as equipment 26, 28, and 30.

Lamination tools 26 may include equipment for pressing together layers of material such as partially cured printed circuit board cores (sometimes referred to as prepreg), layers of metal, dielectric, etc. Lamination tools 26 may apply heat to help cure the layers that are being laminated together.

Patterning tools 28 may include photolithographic tools, etching tools, and other tools for patterning metal layers (e.g., metal layers in printed circuits) to form desired patterns of traces. Tools 30 may be used to form electrical connections (e.g., wire bonds, solder connections, welds, etc.) and may be used to form openings in printed circuit structures (e.g., using stamping, laser drilling, mechanical drilling, cutting, machining, etc.). Openings (e.g., laser-drilled openings formed using lasers in tools 30 or openings formed using other equipment in tools 30) may receive embedded semiconductor dies, metal or other conductive material to form vias, etc.

Tools 30 may be used in applying adhesive films and other layers, may be used in removing temporary films or other layers of material, may be used in assembling components of device 10 together to form all or part of a completed device 10, and may be used to perform other fabrication operations on structures 32 (e.g., laser via formation). During operations such as laser via formation with tools 30, lasers may be used to drill openings in polymer printed circuit layers that are subsequently filled with metal (e.g., using physical vapor deposition, electroplating, and/or other metal deposition techniques).

To conserve space within device 10, it may be desirable to be able to stack electrical components (e.g., multiple semiconductor dies) and to embed semiconductor dies within printed circuits. Dies may be attached to each other to form double-sided dies using layers of material such as die attach film. These double-sided dies may be embedded in openings in printed circuits. The printed circuits into which the semiconductor dies are embedded may be flexible printed circuits (e.g., printed circuits having substrates formed from layers of polyimide or flexible sheets of other polymers) and/or rigid printed circuit boards (e.g., printed circuit boards formed from printed circuit board substrate materials such as fiberglass-filled epoxy).

Figure 3:
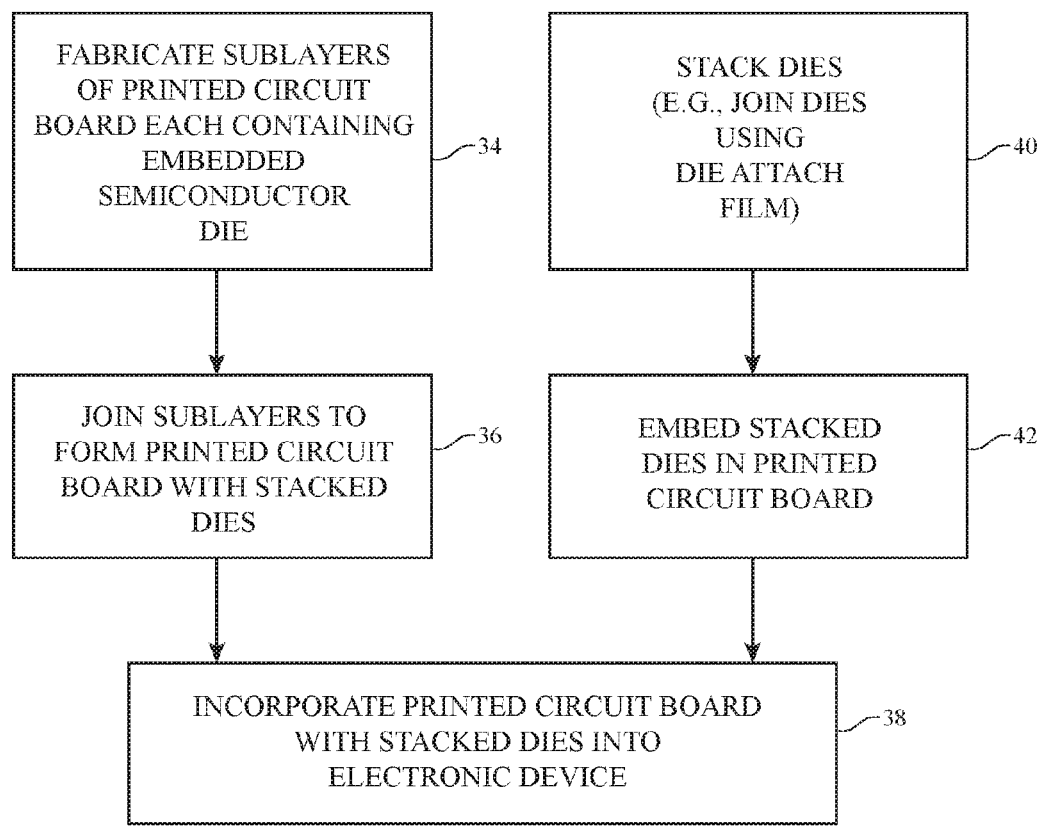
FIG. 3 is a flow chart of illustrative steps involved in forming an electronic device with stacked semiconductor dies in an embedded printed circuit board in accordance with an embodiment.

Illustrative steps involved in forming printed circuits with stacked semiconductor dies are shown in FIG. 3. As shown in FIG. 3, one illustrative approach for forming printed circuits with stacked dies involves fabricating multiple sublayers of printed circuit board material that each include an embedded semiconductor die (step 34) and subsequently joining (e.g., laminating) the sublayers together to form a completed printed circuit (step 36). The printed circuit board with the stacked dies may then be incorporated into device 10 (step 38). With another illustrative approach, semiconductor dies are stacked together at step 40 (e.g., using adhesive such as die attach film or other die bonding techniques) to form a double-sided die. After forming the double-sided semiconductor dies at step 40, the double-sided die may be embedded within a printed circuit (step 42) and assembled with other structures to form device 10 (step 38). If desired, multiple double-sided semiconductor dies may be stacked (e.g., using the operations of steps 34 and 36).

Figure 4:
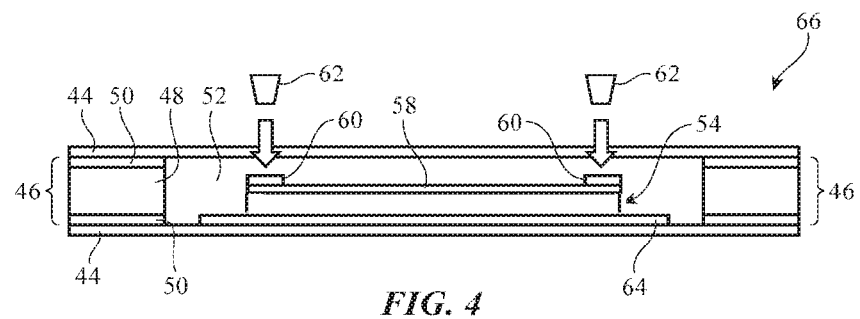
FIG. 4 is a cross-sectional side view of an illustrative die embedded in a printed circuit board layer in accordance with an embodiment.
Figure 5:
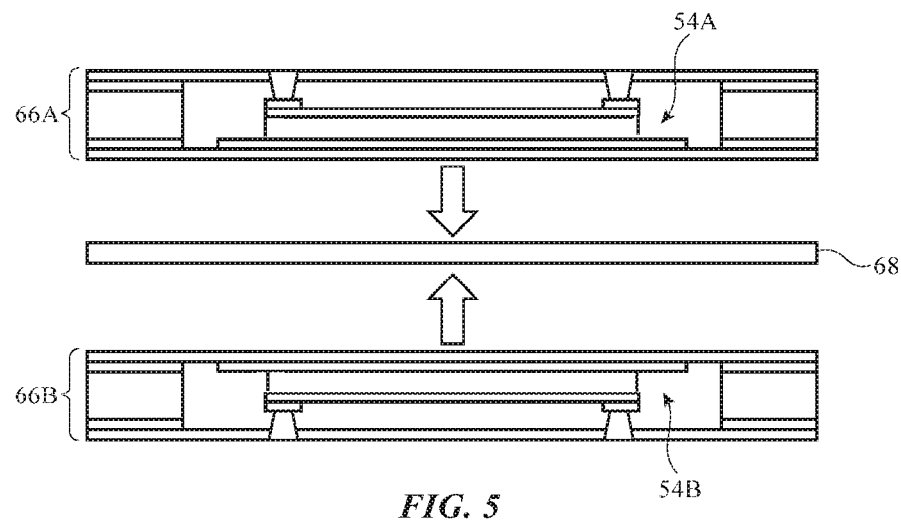
FIG. 5 is a cross-sectional side view of a pair of printed circuit board layers of the type shown in FIG. 4 that have been joined using a layer of prepreg in accordance with an embodiment.
Figure 6:
FIG. 6 is a cross-sectional side view of the pair of printed circuit board layers of FIG. 5 after the layers have been joined to form a printed circuit board in accordance with an embodiment.

An illustrative process for forming a printed circuit from multiple sublayers of printed circuit material each of which includes an embedded semiconductor die is shown in FIGS. 4, 5, and 6. In the example of FIGS. 4, 5, and 6, a single layer semiconductor die is being embedded. If desired, double-sided semiconductor dies may be embedded.

Initially, multiple semiconductor dies such as die 54 are each embedded into a respective printed circuit sublayer such as printed circuit sublayer 66 of FIG. 4. As shown in FIG. 4, sublayer 66 may include metal layers for forming printed circuit traces such as metal layers 44 (e.g., upper and lower metal layers). Metal layers 44 may be, for example, layers of copper foil.

The metal layers in a printed circuit may be separated by dielectric. Dielectric layers may be formed from polymers or other insulating materials. Polymers (e.g., epoxies and other printed circuit board polymeric materials) may initially be partly cured. When partly cured, sufficient polymer cross-linking has taken place to render the epoxy or other polymeric material solid (often in a pliable tacky state). In this partly cured condition, the layers of polymer material in a printed circuit board substrate are sometimes referred to as prepreg layers.

After curing (e.g., by application of heat), prepreg is converted to a fully cured (C-stage) state and forms printed circuit board core material. Printed circuit board substrate material such as prepreg material and core material may sometimes be collectively referred to as substrate material or substrate layers.

As shown in FIG. 4, opposing upper and lower metal layers 44 may be attached to the upper and lower surfaces of substrate 46. Substrate 46 may include core layer 48. Core layer 48 may be sandwiched between upper and lower prepreg layers 50. Prepreg material may be tacky prior to curing which can help adhere layers 44 to substrate layer 46. Semiconductor (e.g., silicon) die 54 may be mounted on lower metal layer 44 using optional adhesive layer 64. As shown in FIG. 4, semiconductor die 54 may have a layer of transistor circuitry 58 and contacts (metal pads) 60. Contacts 60 may be configured to form connections with vias 62 in a completed printed circuit. Vias 62 may be formed from a conductive material such as metal and may be formed using any suitable techniques (e.g., electrochemical deposition following laser drilling or other via hole formation techniques, etc.). Vias 62 may be formed after the structures of sublayer 66 have been laminated together or at other suitable stages of the fabrication process. Vias 62 may be formed using laser drilling of via holes using tools 30 and subsequent metal deposition (e.g., physical vapor deposition of a metal seed layer, electroplating, and/or other metal deposition techniques).

During the process of laminating the layers of FIG. 4 together, some of the prepreg material of layers 50 flows around die 54 (as shown by illustrative embedding substrate material 52), thereby embedding die 54 in printed circuit sublayer 66. Metal layers 44 may be patterned (e.g., to form metal traces for interconnections). Vias (e.g., laser vias formed with tools 30) through substrate material may be used to interconnect metal traces and thereby form desired routing patterns.

To form a printed circuit with multiple stacked and embedded dies, two or more sublayers 66 may be formed. In the example of FIG. 5, two sublayers 66 have been formed: upper sublayer 66A and lower sublayer 66B. Die 54A is embedded within sublayer 66A in a pads-up configuration. Die 54B is embedded within sublayer 66B in a pads-down configuration. Following a first lamination process to form sublayer 66A and a second lamination process to form sublayer 66B, a third lamination process may be used to laminate layers 66A and 66B together with an interposed prepreg layer (prepreg layer 68), thereby forming completed printed circuit 70 of FIG. 6. Lamination tools 26 of FIG. 2 may be used to perform lamination operations when forming the printed circuits for device 10, as described in connection with FIG. 2. In the illustrative configuration of FIG. 6, printed circuit 70 has been formed from two laminated sublayers each of which includes a respective single-sided semiconductor die. If desired, additional sublayers (e.g., three or more sublayers 66) may be laminated together to form printed circuit 70 and/or one or more of the embedded dies may be double-sided semiconductor dies.

In completed printed circuit 70 of FIG. 6, semiconductor die 54A and semiconductor die 54B are both embedded within respective sublayer openings and thereby form a printed circuit with embedded dies. The dies are mounted in alignment with each other (i.e., die 54A is stacked on top of die 54B in circuit 70), so the arrangement of FIG. 6 may sometimes be referred to as a stacked die printed circuit arrangement.

Figure 7:
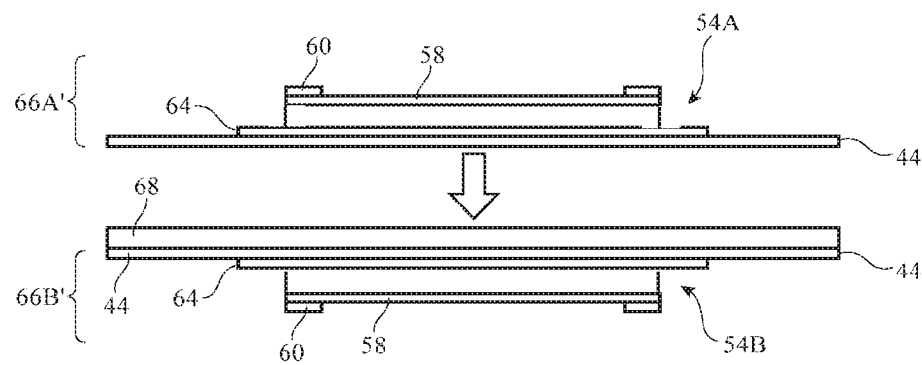
FIG. 7 is a cross-sectional side view of a pair of partially formed printed circuit board layers with respective semiconductor die in accordance with an embodiment.
Figure 8:
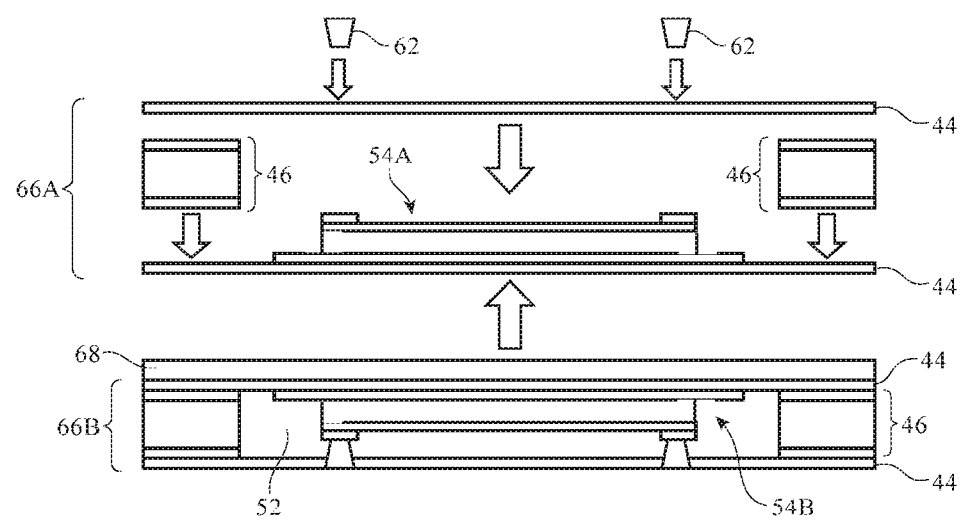
FIG. 8 is a cross-sectional side view of the layers of FIG. 7 during the process of forming a printed circuit in accordance with an embodiment.
Figure 9:
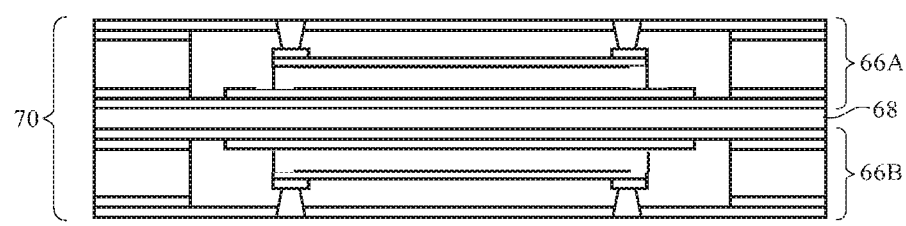
FIG. 9 is a cross-sectional side view of a printed circuit with stacked embedded semiconductor die in accordance with an embodiment.

Another illustrative technique for forming a printed circuit with stacked dies embedded in the printed circuit is shown in FIGS. 7, 8, and 9. With this approach, semiconductor die 54A may be mounted on metal layer 44 in sublayer structures 66A' using adhesive 64 and semiconductor die 54B may be mounted on metal layer 44 in sublayer structures 66B' using adhesive 64. Arrangements such as the arrangement of sublayer structures 66A' may sometimes be referred to as "foil first" arrangements, because metal layer 44 serves as the initial supporting layer for the die. Arrangements such as the arrangement of sublayer structures 66B' (in which metal layer 44 is attached to prepreg layer 68) are sometimes referred to as "core first" arrangements. By using a foil first arrangement for forming one sublayer (e.g., sublayer 66A of FIG. 8) and a core first arrangement for forming another sublayer (e.g., sublayer 66B of FIG. 9), two sublayers can be formed that can be laminated together directly (using the prepreg layer 68 of the core first sublayer), thereby forming completed printed circuit 70 (FIG. 9.). If desired, two core first sublayers may be laminated together. Configurations in which three or more sublayers (including two or more respective core first sublayers) are laminated together may also be used. Single-layer semiconductor dies are shown in FIGS. 7, 8, and 9, but double-layer dies may be used, if desired.

Figure 10:
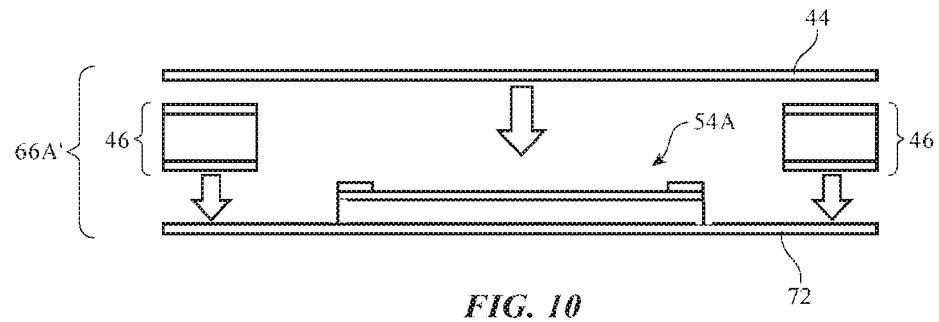
FIG. 10 is a cross-sectional side view of a semiconductor die being embedded within a printed circuit layer using a temporary film in accordance with an embodiment.
Figure 11:
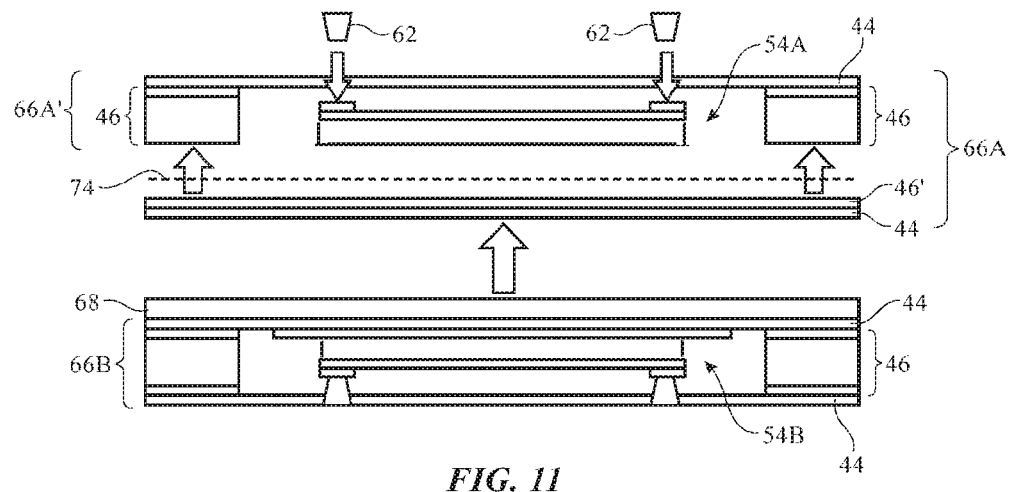
FIG. 11 is a cross-sectional side view of a pair of printed circuit structures with embedded die such as the printed circuit structures of FIG. 10 being joined together following removal of the temporary film in accordance with an embodiment.
Figure 12:
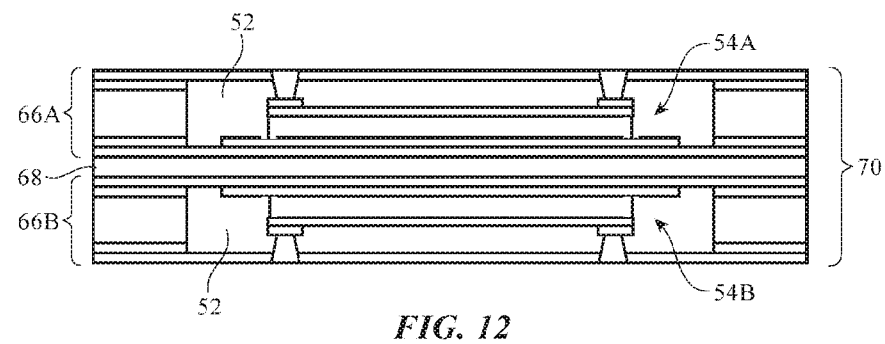
FIG. 12 is a cross-sectional side view of a printed circuit formed from the pair of printed circuit structures of FIG. 11 in accordance with an embodiment.

In the illustrative arrangement of FIGS. 10, 11, and 12, a temporary film (e.g., a flexible polymer film such as die attach film 72 or other removable support structure) may be used to support a semiconductor die during printed circuit fabrication. Initially, as shown in FIG. 10, semiconductor die 54A may be attached to die attach film. While die 54A is attached to film 72, substrate 46 and metal layer 44 may be attached to form sublayer structure 66A'.

After forming structure 66A', film 72 may be removed (see, e.g., dotted line 74 of FIG. 11) and layer 44 and prepreg layer 46' may be attached to structure 66A' to form sublayer 66A. Prepreg layer 68 of FIG. 11 (i.e., a prepreg layer attached to sublayer 66B in a core first arrangement or a separate prepreg layer) may then be used to laminate sublayers 66A and 66B together to form printed circuit 70 of FIG. 12 (e.g., a printed circuit with stacked and embedded semiconductor dies).

To increase die density, some or all of the dies of FIGS. 4-12 or dies embedded in other printed circuit layers (or in semiconductor packages) may be formed using double-sided semiconductor structures. In a double-sided die structure, two semiconductor dies (e.g., two silicon dies) may be attached to each other using a layer of die attach film or other adhesive. The die attach film may be thermally conductive, electrically conductive, magnetically conductive, or may have other desired properties.

Figure 13:
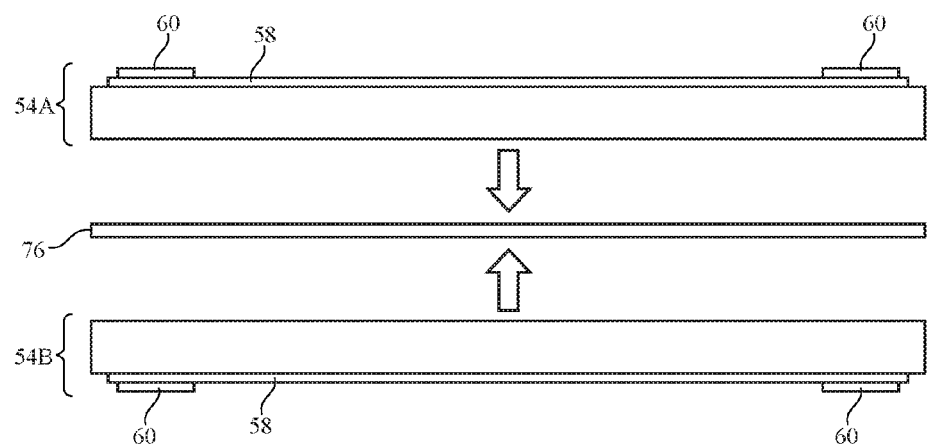
FIG. 13 is a cross-sectional side view of a pair of semiconductor dies being attached to each other in a back-to-back configuration using a die attach film to form a double-sided semiconductor die in accordance with an embodiment.
Figure 14:
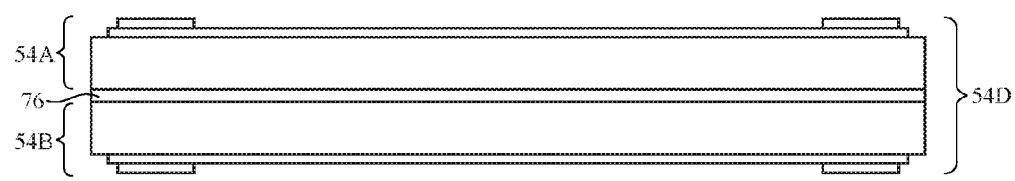
FIG. 14 is a cross-sectional side view of the semiconductor die of FIG. 13 after stacking in accordance with an embodiment.

Consider, as an example, the arrangement of FIG. 13. As shown in FIG. 13, die attach film 76 may be used to attach upper semiconductor die 54A to lower semiconductor die 54B (e.g., using lamination), thereby forming double-sided semiconductor die 54D of FIG. 14. Dies 54A and 54B may be identical or may be different types of devices.

Figure 15:
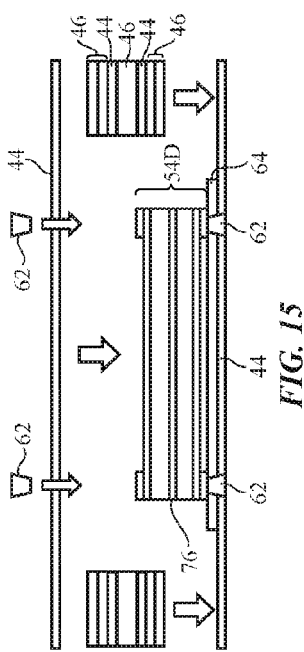
FIG. 15 is a cross-sectional side view of printed circuit board structures into which a double-sided semiconductor die is being embedded in accordance with an embodiment.
Figure 16:
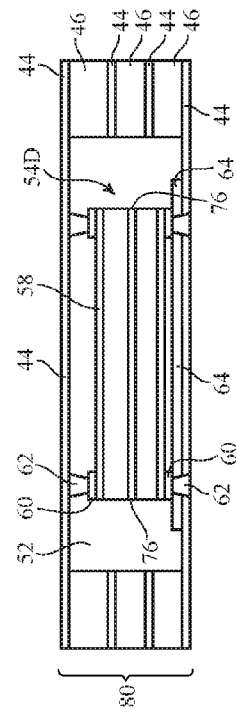
FIG. 16 is a cross-sectional side view of the printed circuit board structures of FIG. 15 following fabrication to form a printed circuit board containing an embedded double-sided die in accordance with an embodiment.

Double-sided semiconductor die 54B (sometimes referred to as a dual stacked semiconductor die) may be embedded within a printed circuit using an arrangement of the type shown in FIGS. 15 and 16. As shown in FIG. 15, double-sided semiconductor die 54D may be attached to lower metal layer 44 using adhesive 64. Die 54D may be mounted in an opening formed through the one or more layers of substrate 46 and one or more metal layers 44 that are under upper metal layer 44. There may be any suitable number of substrate layers 46 and metal layers 44 between the upper and lower metal layers 44 of FIG. 15. The use of fewer layers may help reduce printed circuit thickness. The use of more layers may provide enhanced routing capabilities. After mounting die 54D on adhesive 64, lamination may be used to form printed circuit 80 of FIG. 16. Double-sided semiconductor die 54D is embedded within substrate material due to the presence of embedding substrate material 52 which flows into the opening in substrate 46 in which die 54D is mounted as the prepreg of substrate layers 46 is heated during lamination. This arrangement provides a high density of semiconductor circuitry within a compact printed circuit.

Figure 17:
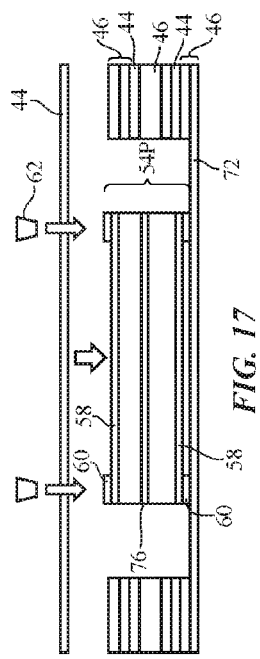
FIG. 17 is a cross-sectional side view of printed circuit board structures being assembled using a temporary film in accordance with an embodiment.
Figure 18:
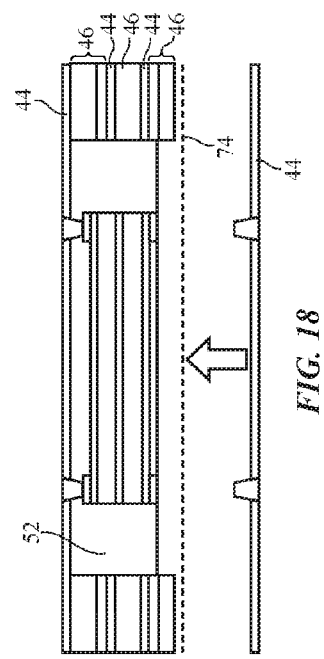
FIG. 18 is a cross-sectional side view of the printed circuit board structures of FIG. 17 following removal of the temporary film in accordance with an embodiment.
Figure 19:
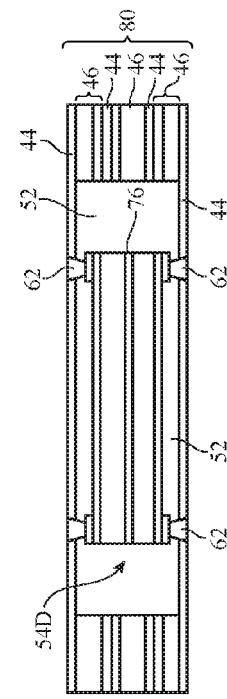
FIG. 19 is a cross-sectional side view of the printed circuit board structures of FIG. 18 following fabrication to form a printed circuit board containing an embedded double-sided die in accordance with an embodiment.

FIGS. 17, 18, and 19 show another illustrative technique for forming a printed circuit with an embedded dual-sided semiconductor die. As shown in FIG. 17, dual-sided semiconductor die 54D may be attached to temporary film 72 (e.g., a die attach film) within an opening in substrate 46 and metal layers 44. A partial lamination may then be performed to cause prepreg from layers 46 to flow and form substrate material 52 that holds double-sided semiconductor die 54D in place. Film 72 may then be removed (as shown by dotted line 74 of FIG. 18) and lower metal layer 44 (which may be covered with a layer of prepreg) may be laminated to the other structures of FIG. 18, thereby forming printed circuit 80 of FIG. 19.

Figure 20:
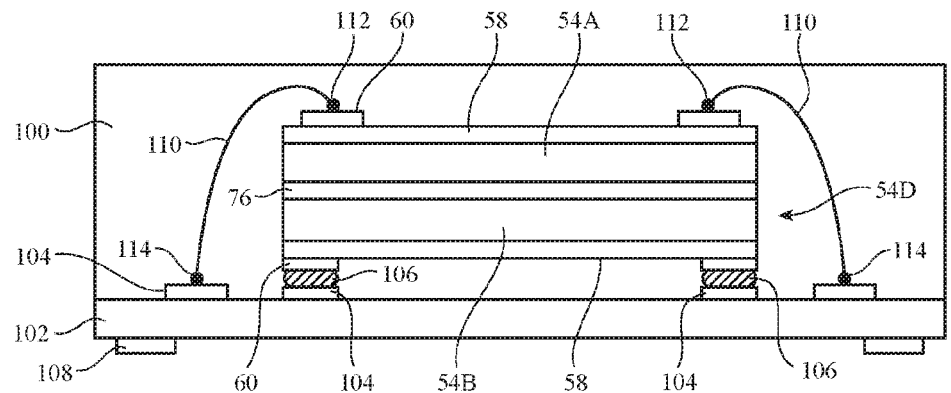
FIG. 20 is a cross-sectional side view of an illustrative double-sided semiconductor die that has been coupled to a substrate using solder joints and wire bonds in accordance with an embodiment.

FIG. 20 is a cross-sectional side view of an illustrative double-sided die that has been coupled to substrate 102 using wire bonds. Substrate 102 may have contacts (pads) 104 to which ends 114 of wire bonding wires 110 are bonded. Opposing ends 112 of bond wires 110 may be wired bonded to contacts 60 on die 54A of double-sided die 54D. Lower die 54B may have contacts 60 that are soldered to mating contacts 104 on substrate 102 using solder 106. Substrate 102 may be part of a printed circuit (i.e., die 54D of FIG. 20 may be embedded within a printed circuit such as printed circuit 70 of FIG. 6, 9, or 12 or printed circuit 80 of FIGS. 16 and 19) or may be part of a semiconductor package, as shown in FIG. 20. In the illustrative package configuration that is shown in FIG. 20, capping layer 100 has been used to cover die 54D and thereby mount die 54D on substrate 102 and substrate 102 has been provided with contacts 108 to allow the package to be attached to a printed circuit. In an embedded printed circuit, material 52 can take the place of material 100.

Figure 21:
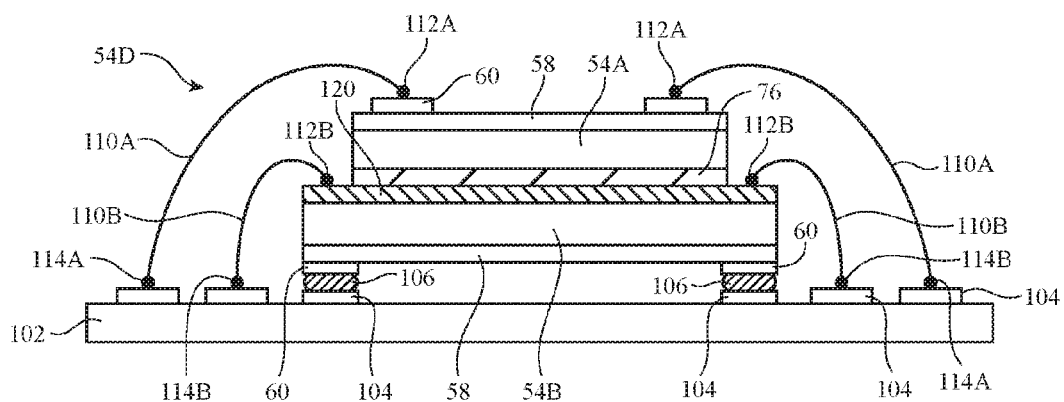
FIG. 21 is a cross-sectional side view of an illustrative double-sided semiconductor die that has been coupled to a substrate with solder joints and wire bonds and that includes a shield layer in accordance with an embodiment.

FIG. 21 is a cross-sectional side view of another illustrative double-sided die that has been coupled to a substrate using wire bonds. Substrate 102 may have contacts 104 to which ends 114A of wire bonding wires 110A are bonded. Opposing ends 112A of bond wires 110A may be wired bonded to contacts 60 on die 54A of double-sided die 54D. Substrate 102 may also have contacts 104 (e.g., ground pads) to which ends 114B of wire bonding wires 110B are bonded. Opposing ends 112B of bond wires 110A may be wired bonded to metal shield layer 120.

Metal shield layer 120 may be interposed between upper die 54A and lower die 54B. For example, layer 120 may be metal coating on die 54B that is attached to die 54A using die attach film 76 or may be a metal foil or other conductive layer that is sandwiched between opposing upper and lower layers of die attach film. Layer 120 may help block electromagnetic signal interference between die 54A and die 54B. Lower die 54B may have contacts 60 that are soldered to mating contacts 104 on substrate 102 using solder 106. Substrate 102 may be part of a printed circuit (i.e., die 54D of FIG. 20 may be embedded within a printed circuit such as printed circuit 70 of FIG. 6, 9, or 12 or printed circuit 80 of FIGS. 16 and 19 using embedding material 52) or may be part of a semiconductor package (e.g., capping layer 100 may cover die 54D of FIG. 21).

The foregoing is merely illustrative and various modifications can be made by those skilled in the art without departing from the scope and spirit of the described embodiments. The foregoing embodiments may be implemented individually or in any combination.

What is claimed is:

1. A printed circuit, comprising:
   a double-sided semiconductor die;
   metal layers; and
   at least one substrate layer that is interposed between the metal layers and that has an opening in which the double-sided semiconductor die is embedded, wherein the at least one substrate layer includes prepreg that flowed to create embedding substrate material around the double-sided semiconductor die that embeds the double-sided semiconductor die within the opening.

2. The printed circuit defined in claim 1 wherein the double-sided semiconductor die comprises a first semiconductor die and a second semiconductor die.

3. The printed circuit defined in claim 2 further comprising a layer of material between the first and second semiconductor dies that attaches the first and second semiconductor dies together.

4. The printed circuit defined in claim 3 wherein the layer of material comprises a die attach film.

5. The printed circuit defined in claim 4 wherein:
   the first semiconductor die has first and second opposing surfaces and has contacts formed on the first surface of the first semiconductor die;
   the second semiconductor dies has first and second opposing surfaces and has contacts on the first surface of the second semiconductor die; and
   the second surface of the first semiconductor die and the second surface of the second semiconductor die both contact the die attach film.

6. The printed circuit defined in claim 5 wherein the metal layers include an upper metal layer and a lower metal layer, the printed circuit further comprising a portion of the embedding substrate material between the double-sided semiconductor die and the lower metal layer.

7. The printed circuit defined in claim 5 wherein the metal layers include an upper metal layer and a lower metal layer, the printed circuit further comprising a layer of adhesive between the between the double-sided semiconductor die and the lower metal layer.

8. The printed circuit defined in claim 1 wherein the at least one substrate layer comprises at least first, second, and third substrate layers.

9. A printed circuit, comprising:
a double-sided semiconductor die;
metal layers; and
at least one substrate layer that is interposed between the metal layers and that has an opening in which the double-sided semiconductor die is embedded, wherein the at least one substrate layer comprises at least first, second, and third substrate layers and the metal layers comprise a first metal layer between the first and second substrate layers and a second metal layer between the second and third substrate layers.

10. The printed circuit defined in claim 1 further comprising laser-formed vias coupled to the double-sided semiconductor die.

11. The printed circuit defined in claim 9, wherein the at least one substrate layer includes prepreg that flowed to create embedding substrate material around the double-sided semiconductor die that embeds the double-sided semiconductor die within the opening.

12. A printed circuit, comprising:
a double-sided semiconductor die;
metal layers; and
at least one substrate layer that is interposed between the metal layers and that has an opening in which the double-sided semiconductor die is embedded, wherein the at least one substrate layer includes partially cured printed circuit board core that flowed to create embedding substrate material around the double-sided semiconductor die that embeds the double-sided semiconductor die within the opening.

13. The printed circuit defined in claim 12 wherein the double-sided semiconductor die comprises a first semiconductor die and a second semiconductor die.

14. The printed circuit defined in claim 13 further comprising a layer of material between the first and second semiconductor dies that attaches the first and second semiconductor dies together.

15. The printed circuit defined in claim 14 wherein the layer of material comprises a die attach film.

16. The printed circuit defined in claim 15 wherein:
the first semiconductor die has first and second opposing surfaces and has contacts formed on the first surface of the first semiconductor die;
the second semiconductor dies has first and second opposing surfaces and has contacts on the first surface of the second semiconductor die; and
the second surface of the first semiconductor die and the second surface of the second semiconductor die both contact the die attach film.

* * * * *